United States Patent [19]
Yoshida et al.

[11] Patent Number: 5,264,049
[45] Date of Patent: Nov. 23, 1993

[54] METHOD OF MANUFACTURING A MULTI-LAYERED WIRING BOARD

[75] Inventors: Risaburo Yoshida, Higashimurayama; Akira Muraki, Ina; Yasuhiro Sakuma, Shiroishi; Masahiro Itoh, Oomiya, all of Japan

[73] Assignee: Toppan Printing Co., Ltd., Tokyo, Japan

[21] Appl. No.: 801,400

[22] Filed: Dec. 2, 1991

[30] Foreign Application Priority Data

Nov. 30, 1990 [JP] Japan .................................. 2-340572
May 9, 1991 [JP] Japan .................................. 3-103017

[51] Int. Cl.$^5$ ............................................. B32B 31/00
[52] U.S. Cl. ................................. 148/269; 156/281; 156/314
[58] Field of Search ............... 148/269; 156/281, 314

[56] References Cited
U.S. PATENT DOCUMENTS 5,147,492  9/1992  Chen .................................. 148/269

FOREIGN PATENT DOCUMENTS 0189913  8/1986  European Pat. Off. .
0232026  8/1987  European Pat. Off. .
0232983  8/1987  European Pat. Off. .
0310010  4/1989  European Pat. Off. .
0321067  6/1989  European Pat. Off. .
0358480  3/1990  European Pat. Off. .
0117282  6/1986  Japan .................................. 148/269

Primary Examiner—Sam Silverberg
Attorney, Agent, or Firm—Burns, Doane, Swecker & Mathis

[57] ABSTRACT

A method of manufacturing a multi-layered wiring board, which is characterized in that the oxidation of a wiring layer for roughening the surface of the layer is performed by two steps (a) oxidizing a wiring layer of inner circuit plate with a first alkaline oxidizing solution thereby forming a first oxidized film comprising CuO and $Cu_2O$, then etching said first oxidized film to obtain a thinned first oxidized film, and (b) oxidizing said thinned first oxidized film with a second alkaline oxidizing solution thereby forming a second oxidized film enriched with $Cu_2O$.

9 Claims, 5 Drawing Sheets

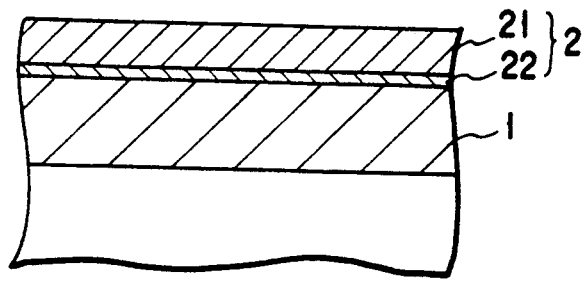
F I G. 12A
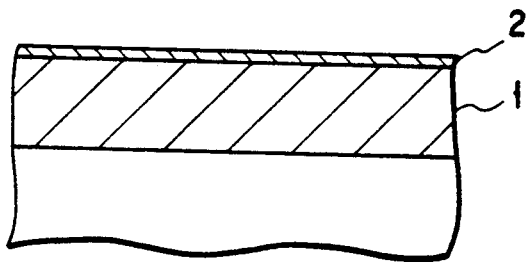
F I G. 12B
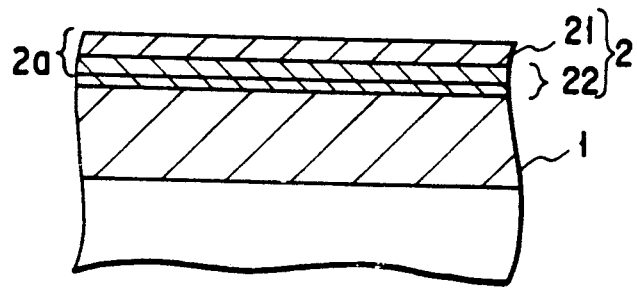
F I G. 12C 15,264,049

METHOD OF MANUFACTURING A MULTI-LAYERED WIRING BOARD

BACKGROUND OF THE INVENTION

1. Field of the Invention

The present invention relates to a method of manufacturing a multi-layered wiring board comprising plurality of inner circuit plates with an adhesive insulating layer interposed therebetween, and more particularly to a method of manufacturing a multi-layered wiring board, which is effective in preventing a defective adhesion between a wiring layer consisting of a copper foil, which is formed on the inner circuit plate, and the adhesive insulating layer, and in preventing treatment agents to be used in the manufacturing process from remaining at an interface between the wiring layer and the adhesive insulating layer.

2. Description of the Related Art

The conventional multi-layered wiring board has been manufactured by a series of steps as shown in FIGS. 1 to 7. Namely, as shown in FIG. 1, a plurality of inner circuit plate "a" having a wiring layer consisting of a copper foil are integrally laminate together with an outer copper foil "al" with an adhesive insulating layer (prepreg) "b" being interposed therebetween. Then, the resultant composite is drilled to form a through hole "c" as shown in FIG. 2. In order to cover the inner wall surface of the through hole "c" with a copper foil, a plating treatment is performed to form a plated layer "d" on the inner surface of the through hole "c" as well as on the surface of the laminated composite as shown in FIG. 3.

Then, a pattern of a photoresist layer "e" is formed over the surface of the plated layer "d" except a surrounding portion of the through hole "c" and a wiring layer-forming portion as shown in FIG. 4. On this exposed portion which is not covered by the photoresist layer "e" is deposited a copper solder plating layer "f" as shown in FIG. 5. After removing the photoresist layer "e", the plated layer "d" is etched off using the copper solder plating layer "f" as a mask as shown in FIG. 6. Finally, a solder-resist layer "g" is formed on a predetermined surface of the laminated composite as shown in FIG. 7, thereby obtaining a multi-layered wiring board "h".

Since the wiring layer formed On the inner circuit plate "a" is constituted by a copper foil of smooth surface, the bonding strength between the inner circuit plate "a" and the adhesive insulating layer (prepreg) "b" is insufficient when a plurality of inner circuit plate "a" are laminated one upon another by interposing the adhesive insulating layer (prepreg) "b" therebetween as mentioned above, so that the peeling between the wiring layer and the adhesive insulating layer "b" is caused to occur increasingly with time.

In order to avoid this problem, there is proposed to make ragged the surface of the wiring layer "i" consisting of a copper foil by oxidizing the surface thereof by using an aqueous solution of alkaline sodium cholite containing for example 15-25 g/l of sodium hydroxide (NaOH), thereby forming a needle crystalline oxide film "j" consisting of CuO and $Cu_2O$.

Through this treatment, the bonding strength between the wiring layer "i" and the adhesive insulating layer "b" can be improved as a whole. However, since the oxide film "j", which is resistive to an alkaline solution, is relatively easily dissolved into an acidic solution, when the exposed laminated surface "k" on the inner wall of the through hole "c" is exposed, as shown in FIG. 9A, to an acidic treatment agent in the manufacturing process of the multi-layered wiring board (for example, when the through hole "c" is treated with an acidic aqueous solution of palladium/tin containing hydrochloric acid in the plating step for making the through hole "c" catalytically sensitivity to an electrolytic copper plating) as shown in FIG. 9A, the oxide film "j", which is contacted with the acidic solution, is dissolved by the acidic solution, so that a portion of copper of the wiring layer "i" is exposed as shown in FIG. 9b. As a result, a phenomenon of so-called "haloing", which is a pink ring "r" in shape, is caused to occur around the through hole "c" as shown in FIG. 10.

When this phenomenon is caused to occur, a space "s" is formed as a result at an interface between the wiring layer "i" and the adhesive insulating layer "b" on the inner wall of the through hole "c", thus inviting the deterioration of the bonding strength of this interface portion, and raising a problem of peeling with time. Further, the treatment agent may be easily intruded into this space "s", and tends to be kept therein, thus markedly degrading the reliability of the product as a multi-layered wiring board.

It has been found out by the present inventors that the reason of why the oxide film "j" formed in accordance with the conventional method does not show a sufficient acid resistance is attributed to the presence of a lot of CuO, which is easily dissolved by an acid, and that if this CuO is diminished, while increasing the ratio of $Cu_2O$ which is relatively resistive to acid, the acid resistance of the oxide film "j" can be highly improved. This invention has been accomplished on the basis of above findings.

Meanwhile, the oxide film as obtained according to the conventional method indicates the ratio of $Cu_2O$ to CuO ($Cu_2O$/CuO $\times$ 100) as being in the range of about 30–40%, and the breadth of the haloing to be formed in the conventional method (the width of the ring, as indicated by a distance "L" in FIG. 10 as measured from the brim of the through hole 0.35 mm in diameter) as being in the range of 130-150 $\mu$m or more, in some case several hundreds micrometers.

SUMMARY OF THE INVENTION

Accordingly, the object of the present invention is to provide a method of manufacturing a multi-layered wiring board, which enables the breadth of the haloing to be controlled to 100 microns or less, thereby making it possible to prevent the defective adhesion between the copper wiring layer formed on the inner circuit plate and the adhesive insulating laver, and at the same time to avoid the accumulation, during the manufacturing process, of the treatment agent at the interface between the wiring layer and the adhesive insulating layer.

Nameiy, according to the present invention, there is provided a method of manufacturing a multi-layered wiring board, comprising the steps Of oxidizing a wiring layer of inner circuit plate having a wiring layer consisting of a copper foil thereby forming an oxidized film comprising CuO and $Cu_2O$ on said wiring layer, thereby obtaining an oxidized inner circuit plate, and laminating a plurality of said oxidized inner circuit plate with an adhesive insulating layer interposed therebetween;

which is characterized in that said step of oxidizing a wiring layer comprises the steps of:

(a) oxidizing a wiring layer of inner circuit plate with a first alkaline oxidizing solution thereby forming a first oxidized film comprising CuO and $Cu_2O$;

(b) etching said first oxidized film to obtain a thinned first oxidized film; and (c) oxidizing said thinned first oxidized film with a second alkaline oxidizing solution thereby forming a second oxidized film enriched with $Cu_2O$.

As for the treatment liquid for oxidizing the wiring layer, an aqueous solution of alkaline sodium chlolite, or an aqueous solution of alkaline potassium persulphate, which has been conventionally employed, can be employed as the first or second alkaline oxidizing solution. The method of oxidizing treatment can be carried out in the same manner as has been conventionally conducted, i.e. by immersing the inner circuit plate into the the treatment liquid after subjecting the inner circuit plate to a defatting treatment.

An oxidizing solution for the second alkaline oxidizing solution may be the same in composition as that of the first alkaline oxidizing solution. However, it is preferable in view of obtaining an oxidized film having an increased content of $Cu_2O$ that the oxidizing solution for the second alkaline oxidizing solution is higher in alkalinity than that of the first alkaline oxidizing solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 12A to 12C are sectional views illustrating the process of the method of the present invention.

DETAILED DESCRIPTION OF THE PREFERRED EMBODIMENTS

Figure 1:
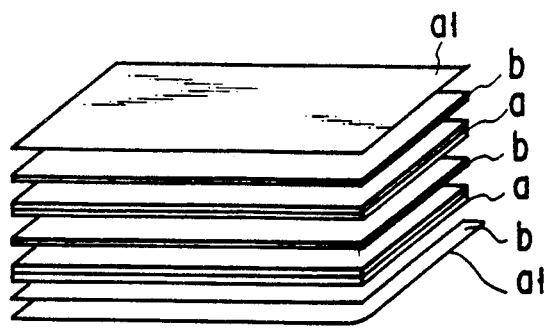
FIGS. 1 to 6 are perspective views illustrating a manufacturing steps of the conventional multi-layered wiring board.
Figure 2:
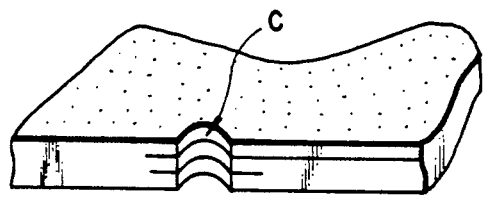
Figure 3:
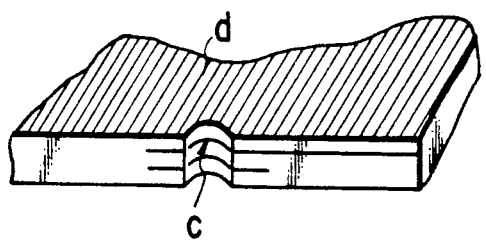
Figure 4:
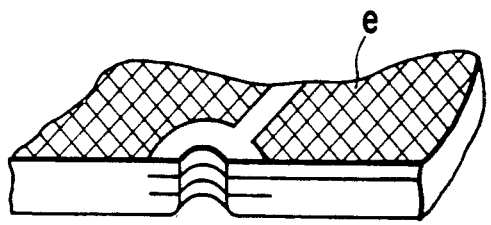
Figure 5:
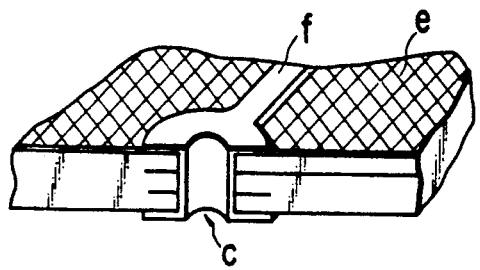
Figure 6:
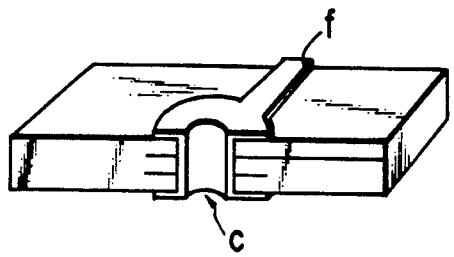
Figure 7:
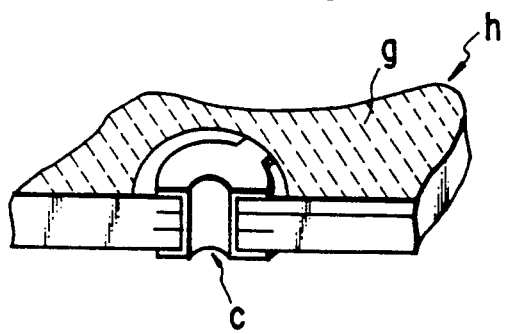
FIG. 7 is a schematic perspective view of the conventional multi-layered wiring board as produced according to the process illustrated in FIGS. 1 to 6.
Figure 8A:
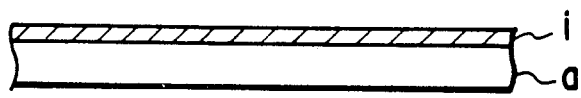
FIGS. 8A and 8B are sectional views illustrating the conventional oxidizing treatment of the surface of a wiring layer.
Figure 8B:
Figure 9A:
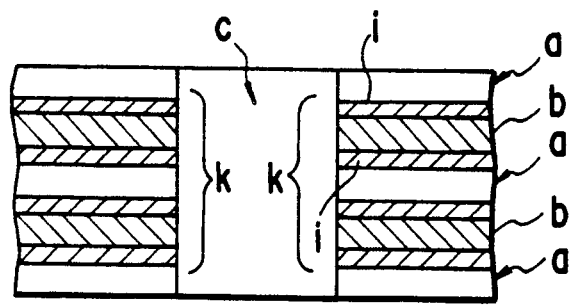
FIGS. 9A and 9B are enlarged sectional views of the conventional multi-layered wiring board after being formed with a through hole.
Figure 9B:
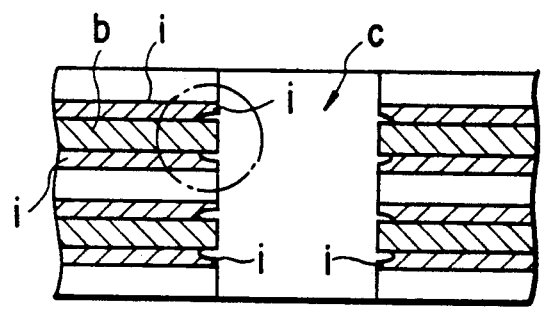

The present invention is featured as explained above in that the oxidation treatment is conducted in two steps, by using an alkaline oxidizing solution, preferably using two kinds of alkaline oxidizing solution different in alkalinity from each other, thereby forming an oxidized film having a high content of $Cu_2O$. To be more specific, a first oxidizing step is conducted by using a first alkaline oxidizing solution such as an aqueous solution of alkaline sodium chlolite, or an aqueous solution of alkaline potassium persulphate, thereby forming on the surface of the copper foil a first oxidized film comprising CuO and $Cu_2O$. In this case, the $Cu_2O$ crystal tends to grow more concentratedly at the initial stage of the oxidation, and then, the needle crystal of CuO tends to grow more concentratedly at the later stage of the oxidation. As a result, the surface region of the oxidized film is blackened.

Accordingly, if the surface region of the first oxidized film is etched off by an etching treatment, thereby removing the CuO crystals contained therein, a thin film having a roughened surface can be left after the etching treatment.

Then, after being washed, the remaining first oxidized film is again subjected to a second oxidizing treatment by using a second alkaline oxidizing solution, which may be the same in composition as that of the first alkaline oxidizing solution, or preferably an alkaline sodium chlorite, or an aqueous solution of alkaline potassium persulphate, each having a higher alkalinity than that of the first alkaline oxidizing solution, thereby forming on the surface of the first oxidized film a second oxidized film having a $Cu_2O$/CuO ratio of about 80% or more. As a result, the finally obtained oxidized film comprising the first and second oxidized film would be a $Cu_2O$-enriched film containing 80% or more of Cu2O on the basis of the amount of CuO contained therein.

It is preferable that the treatment temperature in the second oxidizing treatment is in the range of 40°-85° C., which is lower than the conventional treatment temperature of 90°-95° C., and that the treatment period of time is shorter than those conventionally adopted, i.e. shorter than 4 minutes 30 seconds.

The etching treatment of the first oxidized film formed in the first oxidizing treatment may be performed by using an acidic solution which is capable of dissolving the oxidized film. For example, oxo acid such as diluted sulfuric acid, basic acid such as diluted hydrochloric acid, halogenated hydracid or ammonia water may be employed. The treating period of time may be suitably selected. For example, of the oxidized blackened film which is obtained by oxidizing the copper layer for 4 minutes 30 seconds at a temperature of 95° C., the etching period of time may be about 20 to 30 seconds using a 10 vol % sulfuric acid.

The reason of why the $Cu_2O$/CuO ratio becomes higher when an oxidizing solution having a higher alkalinity than that of the first alkaline oxidizing solution is employed as the second alkaline oxidizing solution is not made clear yet, it is assumed that when an oxidizing solution having a higher alkalinityly is employed, the reaction of "$Cu_2O \rightarrow CuO$" is inhibited, thereby lowering the CuO content.

There is not any particular restriction as to the thickness of the oxidized film, so that as in the case of the convetional one, the thickness of about 1.0 μm may be sufficient. However, since the side wall of the oxidized film to be exposed to the oxidizing solution is enlarged as the thickness of the oxidized film becomes larger, a side etching may become more prominent as the oxidized film of higher thickness is exposed to an acidic treatment solution. Accordingly, the thickness of the oxidized film should be as thin as possible. In an exemplary embodiment, the first oxidized film can be formed with a thickness of 0.6–0.9 μm, and said second oxidized film can be formed with a thickness of, for example, 0.2–1.0 μm.

The manufacturing steps in subsequent to the step of laminating the oxidized inner circuit plate may be suitably selected. For example, the same steps as those of the conventional manufacturing steps, or any other steps may be adopted As for the structure of the inner circuit plate, those having a wiring layer only one surface thereof, or those having a wiring layer on both surfaces thereof may be employed.

According to the present invention, a wiring layer of inner circuit plate is oxidized with a first alkaline oxidizing solution thereby forming a first oxidized film comprising CuO and $Cu_2O$, and then the surface of this first oxidized film is unimiformly etched so as to remove CuO-enriched layer, which is omnipresent in the surface region of the first oxidized film, thereby increasing the $CuO/Cu_2O$ ratio in the etched first oxidized film. In addition to that, this etched first oxidized film is further oxidized with a second alkaline oxidizing solution having an alkalinity, which is the same as, or higher that of the first alkaline oxidizing solution thereby to obtain the second oxidized film having a higher $Cu_2O/CuO$ ratio of about 80% or more.

Therefore, as the ratio of the acid-resistive $Cu_2O$ is increased as explained above, the acid resistivity of the resultant oxidized film consisting of the first and second oxidized films will be accordingly improved. As a result, the oxidized film of the wiring layer will be hardly dissolved during an acidic treatment in the manufacture of the multi-layered wiring board so that the haloing phenomenon in which the metal copper is partially exposed can be effectively inhibited.

The present invention will be further explained with reference to the drawings.

EXAMPLE 1

A multi-layered wiring board was manufactured by the following steps.

(1) First, a copper laminated glass/epoxy plate covered on its both surfaces thereof with copper foil (340 mm × 510 mm × 1.6 mm) was employed, and was photoetched by the conventional method to obtain an inner circuit plate.

(2) Then, a 25% solution of Neutral Clean 68 (trademark, Shipray Co.) was employed to perform defatting treatment on the copper foil wiring layers formed on the both surfaces of the inner circuit plate. The wiring layers thus treated was water-washed.

(3) A solution containing 15% of Etch 746 (trademark, Shipray Co.) and 10% of $H_2O_2$ was employed perform a soft etching on the surfaces or the inner circuit plate for 60 seconds. The etched product was then water-washed.

(4) Then, the inner circuit plate was washed with a solid acid containing as a main component sulfuric acid (44 g/l).

(5) The wiring layer of the inner circuit plate thus pretreated was subjected to an acid treatment under the conditions shown below to form an oxized film 2 comprising CuO and $Cu_2O$ On the surface of a wiring layer 1 as shown in FIG. 12A, and then the oxidized film 2 was washed with water.

In FIG. 12A, reference numeral 21 denotes an oxidized film containing CuO as a main component, and 22 denotes an oxidized film containing $Cu_2O$ as a main component.

| (Conditions in the first Oxidizing step) | | |
|---|---|---|
| Components of oxidizing solution: | $Na_3PO_4:12H_2O$ | 17 g/l |
| | NaOH | 21 g/l |
| | $NaClO_2$ | 43 g/l |
| Temperature of treatment solution: | | 90° C. |
| Treatment time: | | 4 min. 30 sec. |

(6) The inner circuit plate thus oxidized was immersed in a 10% aqueous solution of $H_2SO_4$ for 20–30 seconds, and then was subjected to etching treatment until the surface layer of the oxidized film 2 is suitably removed as shown in FIG. 12B. The etched oxidized film 2 was then washed with water.

(7) The etched oxidized film 2 was then subjected to a second oxidizing treatment under the following conditions, thereby forming an oxidized film 2a. This oxidized film 2a was then washed with cold water and then with hot water. Finally, the inner circuit plate was dried at a temperature of 130° C.

| (Conditions in the second oxidizing step) | | |
|---|---|---|
| Components of oxidizing solution: | $Na_3PO_4:12H_2O$ | 17 g/l |
| | NaOH | 21 g/l |
| | $NaClO_2$ | 43 g/l |
| Temperature of treatment solution: | | 80° C. |
| Treatment time: | | 3 min. |

The thickness of the oxidized film 2a was found to be 0.6 μm as a result of Auger spectral analysis, and the $Cu_2O/CuO$ ratio therein was found to be 80% according to the measurement by a thin film X-ray diffraction analysis apparatus.

(8) A plurality of the dried inner circuit plates were laminated one upon another together with a copper foil for an outer layer with adhesive insulating layer being interposed therebetween. Then whole laminated composite was thermally compressed to obtain a multi-layered wiring board.

(9) Through holes were formed by drilling the multi-layered wiring board with a drill 0.35 mm in diameter.

(10) After washing the multi-layered wiring board with an acid in the conventional manner, an electroless copper plating and a panel plating were applied to the inner wall of the through holes as well as to the surface of the wiring board, thereby forming thereon a copper plating 20 μm in thickness.

(11) After the ordinary treatments such as washing with water and washing with an acid were performed on the multi-layered wiring board, a resist patterning was formed on the surface of the multi-layered wiring board, and then electrolytic copper plating (secondary copper plating, 20 μm in thickness) was formed on the exposed surface of the multi-layered wiring board using the resist as a mask thereby finally obtaining a multi-layered wiring board.

Figure 10:
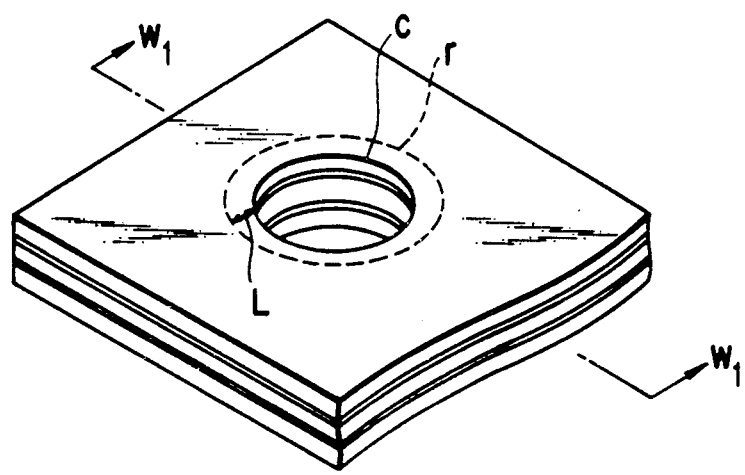
FIG. 10 is an enlarged perspective view of the conventional multi-layered wiring board after forming a through hole.
Figure 11:
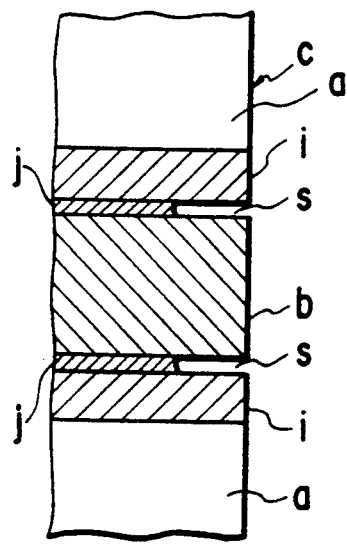
FIG. 11 is a partial sectional view, taken along the line $W_1$—$W_1$ in FIG. 10.

The multi-layered wiring board thus obtained was measured of breadth of the haloing formed on the multi-layered wiring board. As a result, the width "L" of the pink ring (FIG. 10) was found to be 64 μm.

COMPARATIVE EXAMPLE 1

For the purpose of comparison, the procedures of the Example 1 was repeated except that the steps (6) and (7) were omitted, thereby forming an oxidized film, and then a multi-layered wiring board was manufactured. This multi-layered wiring board was found to be 33% in the $Cu_2O/CuO$ ratio, and 140 μm width "L" of the pink ring, indicating that the breadth of the haloing can be diminished to less than 50% according to the present invention.

EXAMPLE 2

The same procedures as described in Example 1 were repeated excepting that the first oxidizing treatment (step 5) was conducted at a temperature of 80°–95° C. with immersion period of 180–480 seconds, the etching treatment (step 6) was conducted for 2–60 seconds, and the second oxidizing treatment (step 7) was conducted for 60–480 seconds, thereby obtaining a multi-layered wiring board. This multi-layered wiring board was found to be 28–95 μm in width "L" of the pink ring.

EXAMPLE 3

The same procedures as described in Example 1 were repeated excepting that the first and the second oxidizing treatments were modified as follows, thereby obtaining an inner circuit plate having a wiring layer covered with an oxidized film 0.6 μm in thickness.

| (Conditions in the first oxidizing step) | | |
|---|---|---|
| Components of oxidizing solution: | $Na_3PO_4 \cdot 12H_2O$ | 17 g/l |
| | NaOH | 21 g/l |
| | $NaClO_2$ | 43 g/l |
| Temperature of treatment solution: | | 90° C. |
| Treatment time: | | 4 min. 30 sec. |
| (Conditions in the second oxidizing step) | | |
| Components of oxidizing solution: | $Na_3PO_4 \cdot 12H_2O$ | 17 g/l |
| | NaOH | 31 g/l |
| | $NaClO_2$ | 43 g/l |
| Temperature of treatment solution: | | 80° C. |
| Treatment time: | | 4 min. |

The thickness of the resultant oxidized film was found to be 0.6 μm as measured by means of Auger spectral analysis, and the $Cu_2O/CuO$ ratio therein was found to be 150% according to the measurement by a thin film X-ray diffraction analysis apparatus.

As in the case of the Example 1, after drying the inner circuit plate formed with the oxidized layer 2, a plurality of the dried inner circuit plates were laminated one upon another together with a copper foil for an outer layer with adhesive insulating layer being interposed therebetween. Then whole laminated composite was thermally compressed to obtain a multi-layered wiring board.

Then, through holes were formed by drilling the multi-layered wiring board with a drill 0.35 mm in diameter. After washing the multi-layered wiring board with an acid in the conventional manner, an electroless copper plating and a panel plating were applied to the inner wall of the through holes as well as to the surface of the wiring board, thereby forming thereon a copper plating 20 μm in thickness.

After the ordinary treatments such as washing with water and washing with an acid were performed on the multi-layered wiring board, a resist patterning was formed on the surface of the multi-layered wiring board, and then electrolytic copper plating (secondary copper plating, 20 μm in thickness) was formed on the exposed surface of the multi-layered wiring board using the resist as a mask thereby finally Obtaining a multi-layered wiring board.

The multi-layered wiring board thus obtained was measured of breadth of the haloing formed on the multi-layered wiring board. As a result, the width "L" of the pink ring (FIG. 10) was 60 μm or less.

As a result, it was confirmed that the present invention is very effective in diminishing the breadth of the haloing, in strengthening the bonding strength between the wiring layer and the adhesive insulating layer, and in avoiding the accumulation of treatment agent at an interface between the wiring layer and the adhesive insulating layer.

As explained above, it has become possible, according to the present invention, to inhibit the dissolution of an oxidized film of the wiring layer during an acid treatment, and to minimize the haloing phenomenon.

Accordingly, it has become possible to prevent the occurrence of any defective bonding between the wiring layer and the adhesive insulating layer, and to avoid the accumulation of treatment agent at an interface between the wiring layer and the adhesive insulating layer, thereby improving the reliability of the product as a multi-layered wiring board.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a multi-layered wiring board, comprising the steps of:
   oxidizing a wiring layer of at least one inner circuit plate having a wiring layer consisting of a copper foil to form an oxidized film comprising CuO and $Cu_2O$ on said wiring layer and thereby obtain an oxidized inner circuit plate, and
   laminating a plurality of said oxidized inner circuit plates with an adhesive insulating layer interposed therebetween,
   said step of oxidizing a wiring layer further comprising the steps of:
   (a) oxidizing a wiring layer of said at least one inner circuit plate with a first alkaline oxidizing solution thereby forming a first oxidized film comprising CuO and $Cu_2O$;
   (b) etching said first oxidized film to obtain a thinned first oxidized film; and
   (c) oxidizing said thinned first oxidized film with a second alkaline oxidizing solution thereby forming a second oxidized film enriched with $Cu_2O$.

2. A method according to claim 1, wherein said second alkaline oxidizing solution is the same in composition as that of said first alkaline oxidizing solution.

3. A method according to claim 1, wherein said second alkaline oxidizing solution is higher in alkalinity than that of said first alkaline oxidizing solution.

4. A method according to claim 1, wherein said step (c) is operated at a lower temperature than a temperature employed in said step (a).

5. A method according to claim 4, wherein said step (a) is operated at a temperature of 90°–95° C., while said step (c) is operated at a temperature of 40°–85° C.

6. A method according to claim 5, wherein said step (c) is operated in a shorter period of time than a time period for operating said step (a).

7. A method according to claim 1, wherein said steps establish said first oxidized film with a thickness of 0.6–0.9 μm, a surface of said first oxidized film being roughened.

8. A method according to claim 1, wherein said steps establish said second oxidized film with a thickness of 0.2–1.0 μm.

9. A method according to claim 1, wherein a value of a $Cu_2O/CuO$ ratio in an oxidized film finally obtained is 80% or more.

* * * * *